United States Patent [19]

Iwamuro

[11] Patent Number: 5,122,854
[45] Date of Patent: Jun. 16, 1992

[54] MOS CONTROL THYRISTOR

[75] Inventor: Noriyuki Iwamuro, Kawasaki, Japan

[73] Assignee: Fuji Electric Co., Ltd., Kawasaki, Japan

[21] Appl. No.: 659,943

[22] Filed: Feb. 22, 1991

Related U.S. Application Data

[63] Continuation-in-part of Ser. No. 541,685, Jun. 21, 1990, abandoned.

[51] Int. Cl.$^5$ .............. H01L 29/74; H01L 29/10
[52] U.S. Cl. ........................... 357/38; 357/23.4
[58] Field of Search ............ 357/38, 91, 23.4, 90

[56] References Cited

U.S. PATENT DOCUMENTS

| | | | |
|---|---|---|---|
| 4,315,271 | 2/1982 | Roger | 357/38 |
| 4,631,564 | 12/1986 | Neilssone et al. | 357/38 |
| 4,646,117 | 2/1987 | Temple | 357/38 |
| 4,821,095 | 4/1989 | Temple | 357/38 |
| 4,851,889 | 7/1989 | Matsuzaki | 357/38 |
| 4,857,983 | 8/1989 | Baliga | 357/38 |
| 4,888,627 | 12/1989 | Pattanayah et al. | 357/38 |
| 4,912,541 | 3/1990 | Baliga | 357/38 |

Primary Examiner—Mark Prenty
Attorney, Agent, or Firm—Spencer, Frank & Schneider

[57] ABSTRACT

A MOS control thyristor comprising a first region of a first conductivity type doped with a first impurity having a first concentration, a second region of a second conductivity type provided on the first region and doped with a second impurity having a second concentration which is lower than the first concentration, and a third region of the first conductivity type selectively formed in the surface of the second region. A fourth region of the second conductivity type is selectively formed in the surface of the third region, a fifth region of the second conductivity type is selectively formed so that it protrudes through the fourth region into the third region, and a sixth region of the first conductivity type is selectively formed so that it is in contact with the fifth region. The impurity dose amount in the third region is within the range $1 \times 10^{13}$ cm$^{-2}$ to $7 \times 10^{14}$ cm$^{-2}$, and the impurity concentration in the third region is within the range $1.25 \times 10^{16}$ cm$^{-3}$ to $8.75 \times 10^{17}$ cm$^{-3}$.

1 Claim, 2 Drawing Sheets

MOS CONTROL THYRISTOR

This application is a continuation-in-part of application Ser. No. 07/541,685 filed Jun. 21st, 1990 and now abandoned.

BACKGROUND OF THE INVENTION

1. Field of the Invention

The present invention relates to a MOS control thyristor which is used as a power switching element. In particular, it relates to a MOS control thyristor which can be reliably turned-off and which is less susceptible to avalanche breakdown when it is turned-off under such conditions that the thyristor is connected to an inductive load.

2. Description of the Prior Art

As a kind of thyristor which can be turned-off, a gate turn-off thyristor (hereinafter referred to as a "GTO") is a widely used. However, as the GTO is so-called current-controlled element, it requires a relatively large amount of gate-driving current, etc.. So as to overcome such problems, a MOS gate thyristor has been developed, the gate of which is controlled by a voltage drive. This MOS gate thyristor has a structure in which a wide-base bipolar transistor is driven by a MOS gate, and is similar to an insulated gate type bipolar transistor (hereinafter referred to as a "IGBT") in the structure thereof.

The difference between the MOS gate thyristor and the IGBT is that, while latching of an inner parasitic thyristor is prevented in the IGBT, latching of the inner parasitic thyristor occurs in the MOS gate thyristor. Accordingly, when turning-off the MOS gate thyristor, not only the gate voltage but the anode voltage must be reversed in polarity.

In recent years, a MOS Control Thyristor (MCT) using a MOS gate for turning-on as well as turning-off has been developed. In this structure, MOSFETS for turning-on and for turning-off are installed in a p⁻ n⁻ p⁻ n thyristor. Namely, on a first region of a first conductivity type (e.g. n-type) having a high impurity concentration and of low specific resistance, a second region of a second conductivity type (e.g. p-type) having high specific resistance is formed. Then, a third region of the first conductivity type is selectively formed on the surface of this second region. Further, a fourth region of the second conductivity type is selectively formed on the surface of the third region. And lastly, a fifth region of the second conductivity type and a sixth region of the first conductivity type are formed on the surface of the fourth region. And, a gate electrode is formed through gate isolation layers on a channel region which is defined respectively as a surface region between a first part of the third region and the fourth region, and as a surface region between a second part of the third region and the sixth region. Further, a cathode electrode is so formed that it contacts the fifth and the sixth region, and an anode electrode is formed on the surface of the first region.

This element operates with the cathode electrode being grounded and with voltages applied to the gate electrode and the anode electrode. For example, assuming that the first conductivity type is n-type and the second conductivity type is p-type, a p channel is formed between the fourth region of p layer and the second region of p⁻ layer when a negative voltage is applied to the gate electrode 8 of the thyristor to turn on.

Thereby, when a negative voltage is applied to the anode electrode, holes that are formed in the p channel begin to flow from the p channel to the anode, and turn on the junction n⁺/p⁻ between the first region and the second region. Thereby, electrons flow from the n⁺ layer of the first region into the p⁻ layer of the second region. The electrons pass through the p⁻ layer of the second region and the n layer of the third region, and turn on the junction n/p⁺ between the third region and the fifth region. Therefore, hole injection occurs from the fifth region and turns the npnp thyristor on.

From the above, it can be seen that the conductivity is modulated within the second and third regions, and the resistance when turning-on is reduced.

When the thyristor turns-off, and if a positive voltage is applied to the gate electrode, an n channel is formed on the surface region of the fourth region defined between the n layer of the third region and the n⁺ layer of the sixth region. Thereby, the third region and the fifth region are at the same potential level. Accordingly, electrons injected from the first region, even if they reach the junction n/p⁺ between the third region and the fifth region, flow out to the cathode through the formed n channel. Thereby, the turn-off operation is completed without hole injection occurring from the fifth region.

In the MOS control thyristor aforementioned, the third region and the fifth region are basically at the same potential level when the thyristor is turned off. However, a very small potential difference $\Delta V$ actually appears between the third region and the fifth region due to current flowing in the n channel and the third region. When this $\Delta V$ is more than the diffusion potential difference between the third region and the fifth region, since the junction between the third region and the fifth region turns on, it is impossible to a turn-off operation.

Further, when the thyristor turns off under such condition that an inductive load (L load) is connected thereto, a voltage due to the inductive load counter electromotive force is applied to the junction between the second region and the third region as a reverse biasing voltage. Thereby, a large electric field appears at the aforementioned junction. Moreover, in case the first conductivity type is the n-type and the second conductivity type is the p-type, since the npn transistor composed of the first, second and third regions will continue to produce a constant current, the main current thereof becomes an electron current.

Generally speaking, the impact ionization rate of the electrons when applying a high electric field (higher than $10^5$ V/cm) is 100 to 1000 times larger than that of holes. Therefore, there is a drawback in that avalanche breakdown is liable to occur.

SUMMARY OF THE INVENTION

An object of the present invention is to resolve the above-mentioned problems, thereby to provide a MOS control thyristor which can be reliably turned-off and which is less susceptible to avalanche breakdown.

The MOS control thyristor according to the present invention comprises: a first region of a first conductivity type which is doped with a first impurity having a first concentration; a second region of a second conductivity type which is provided on the first region and is doped with a second impurity having a second concentration which is lower than the first concentration: a third region of the first conductivity type which is selectively formed in the surface of the second region; a fourth region of the second conductivity type which is selectively formed in the surface of the third region; a fifth region of the second conductivity type which is selectively formed so that it protrudes through the fourth region into the third region; and a sixth region of the first conductivity type which is selectively formed so that it is in contact with the fifth region. The MOS control thyristor of this invention is characterized in that the dose quantity or amount in the third region is within the range of $1 \times 10^{13}$ cm$^{-2}$ to $7 \times 10^{14}$ cm$^{-2}$ and the impurity concentration in the third region is within the range of $1.25 \times 10^{16}$ cm$^{-3}$ to $8.75 \times 10^{17}$ cm$^{-3}$.

By setting the impurity dose amount in the third region within the range from $1 \times 10^{13}$ cm$^{-2}$ to $7 \times 10^{14}$ cm$^{-2}$ and the impurity concentration in the third region within the range from $1.25 \times 10^{16}$ cm$^{-3}$ to $8.75 \times 10^{17}$ cm$^{-3}$, the resistance of the third region is reduced and the potential difference appearing at the junction between the third and the fifth regions decreases. And, the specific resistance of the second region is set at a high resistance above 250 Ω cm in order to weaken the electric field strength appearing at the junction between the second region and the third region when turning-off under such condition that an inductive load is connected thereto.

The above and other objects, effects, features and advantages of the present invention will become more apparent from the following description of embodiments thereof taken in conjunction with the accompanying drawings.

DETAILED DESCRIPTION OF PREFERRED EMBODIMENTS

A detailed explanation will now be provided for the embodiments of the invention with reference to the attached drawings.

Figure 1:
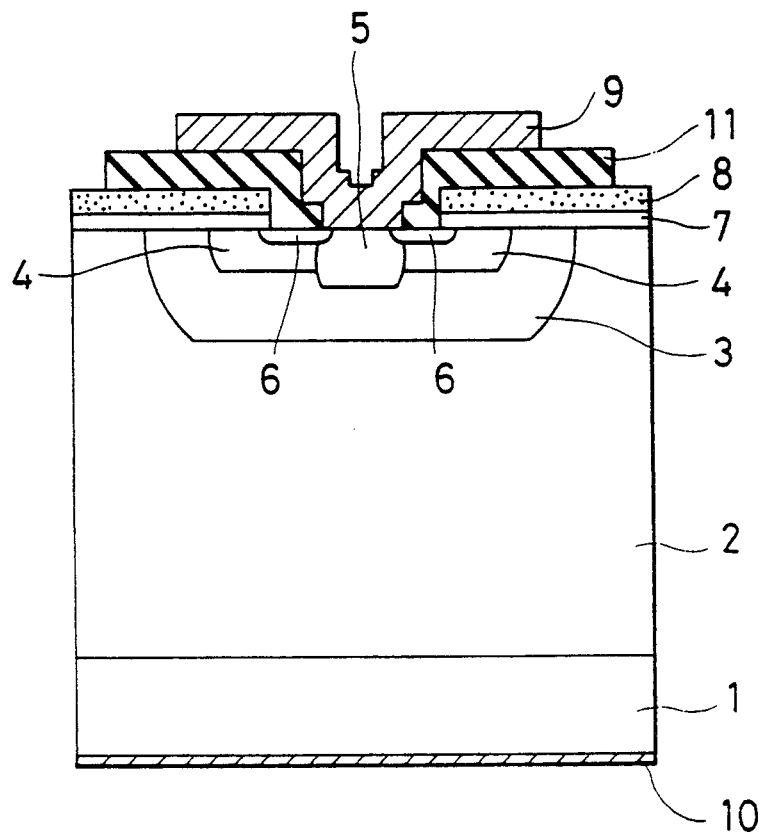
FIG. 1 is a sectional view showing an embodiment of a MOS control thyristor according to the present invention.

FIG. 1 is a sectional view showing an embodiment of a MOS control thyristor according to the present invention. First of all, a p$^-$ layer 2 is formed on the surface of an n$^+$ layer 1 constructing a substrate. Here, the impurity concentration of the n$^+$ layer is at least $5 \times 10^{18}$ cm$^{-3}$, namely the specific resistance of the n$^+$ layer is not more than 0.01 Ω cm. And, the impurity concentration of the p$^-$ layer is $1.5 \times 10^{13}$ cm$^{-3}$ or less, namely the specific resistance of the p$^-$ layer is 250 Ω cm or more. Next, a gate oxide layer 7 is selectively formed on the p$^-$ layer 2. Further, a gate electrode 8 is formed on the gate oxide layer 7. Then, ion implantation is carried out to form an n layer 3 using the gate electrode 8 as a mask. After forming the n layer 3 by ion implantation, a p layer 4, a p$^+$ layer 5 and an n$^+$ layer 6 are sequentially formed in the manner described above by the ion implantation and thermal diffusion methods. Here, the temperature and time conditions of the thermal diffusion are 1150° C. and 8 hr so that the diffusion depth of the n layer 3 is 8 μm, and the diffusion depth of the p layer 4 is 4 μm. In this case, the impurity concentration range of the n layer 3 corresponding to the dose quantity of the ion implantation that is from $1 \times 10^{13}$ cm$^{-2}$ to $7 \times 10^{14}$ cm$^{-2}$ is from $1.25 \times 10^{16}$ cm$^{-3}$ to $8.75 \times 10^{17}$ cm$^{-3}$. An insulation layer 11 is formed on the gate electrode 8 and n$^+$ layer 6, a cathode electrode 9 is formed on the insulating layer 11 and p$^+$ layer 5, and an anode electrode 10 is formed on the surface of the n$^+$ layer 1 thereby completing the control thyristor.

Figure 2:
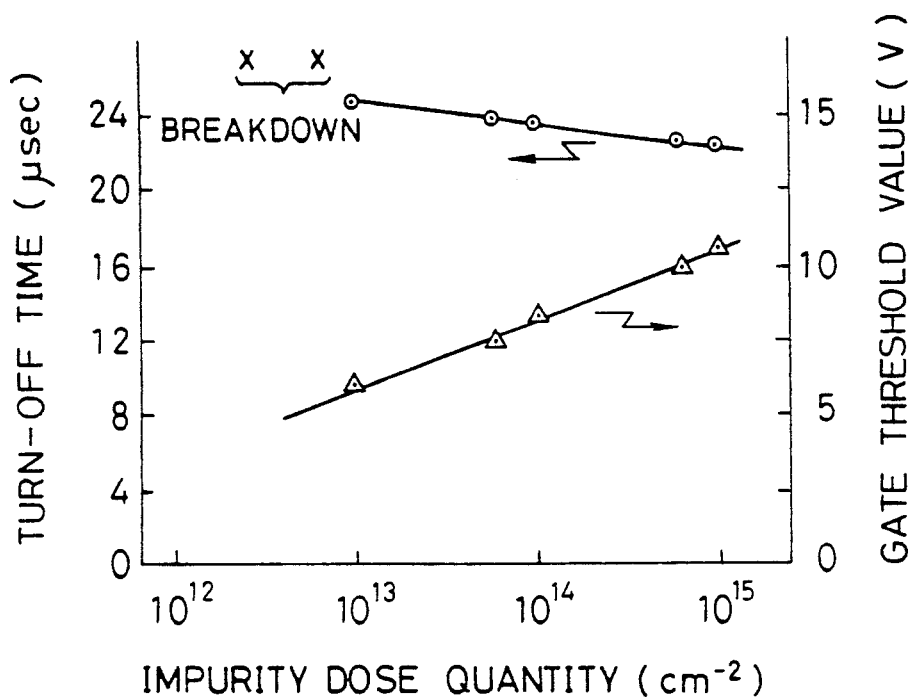
FIG. 2 shows the relationship between turn-off time and threshold value when changing the dose quantity of the n layer with the embodiment shown in FIG. 1.

FIG. 2 shows the relationship between the turn-off time and the threshold value with respect to the impurity dose quantity of the n layer 3 within the MOS control thyristor shown in FIG. 1. As is shown in the drawing, the turn-off time does not change significantly above an impurity dose amount of $1 \times 10^{13}$ cm$^{-2}$ in the n layer 3 and when the impurity concentration of the n layer 3 is $1.25 \times 10^{16}$ cm$^{-3}$. In contrast, for impurity dose amounts less than $1 \times 10^{13}$ cm$^{-2}$ and at an impurity concentration of $8.75 \times 10^{17}$ cm$^{-3}$, since hole injection occurs from the p$^+$ layer 5, a turning-off operation itself is impossible, resulting in the breakdown at the end. On the other hand, increasing the dose quantity to increase the impurity concentration too much causes the gate threshold value when turning-off to becomes too large. For example, if the dose quantity becomes more than $7 \times 10^{14}$ cm$^{-2}$ and the impurity concentration becomes $8.75 \times 10^{17}$ cm$^{-3}$, the gate threshold value is 10 V and is not suitable for practical use.

From the above, it is apparent that the dose quantity should be in the range from $1 \times 10^{13}$ cm$^{-2}$ to $7 \times 10^{14}$ cm$^{-2}$ and the impurity concentration should be in the range from $1.25 \times 10^{16}$ cm$^{-3}$ to $8.75 \times 10^{17}$ cm$^{-3}$ so that no breakdown occurs and the gate threshold value is within a practical level. Preferably, the dose quantity is from $3 \times 10^{13}$ cm$^{-2}$ to $5 \times 10^{14}$ cm$^{-2}$, and the impurity concentration is from $3.75 \times 10^{16}$ cm$^{-3}$ to $6.25 \times 10^{17}$ cm$^{-3}$.

Figure 3:
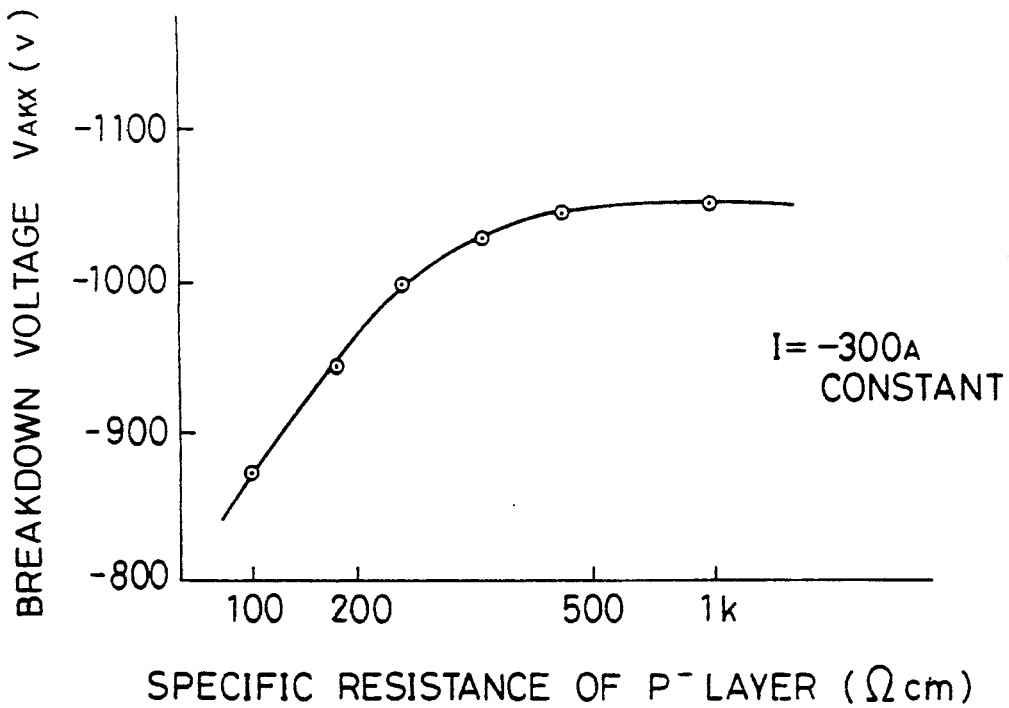
FIG. 3 shows the relationship the between turn-off breakdown voltage $V_{AKX}$ and the specific resistance of the p$^-$ layer with the embodiment shown in FIG. 1.

FIG. 3 shows the relationship between the turn-off breakdown voltage $V_{AKX}$, and the specific resistance of the p$^-$ layer 2 within the MOS control thyristor shown in FIG. 1 when turning-off under the condition that an inductive load is connected. In addition, the dose quantity of the n layer is $7 \times 10^{13}$ cm$^{-2}$ and constant at this time.

From FIG. 3, the higher the specific resistance of the p$^-$ layer 2, the larger the breakdown voltage $V_{AKX}$, and the less the possibility of an avalanche breakdown. For instance, the condition of the breakdown is, if $V_{AKX}$ is 1000 V and I is −300 A, it is apparent from FIG. 3, that the specific resistance is larger than 250 Ω cm. Moreover, in the above explanation, it is apparent that the same argument can be established if the n type material is replaced by p type material.

The invention has been described in detail with respect to preferred embodiments, and it will now be apparent from the foregoing to those skilled in the art that changes and modifications may be made without departing from the invention in its broader aspects, and it is the intent, therefore, in the appended claims to cover all such changes and modifications as fall within the true spirit of the invention.

What is claimed is:

1. A MOS control thyristor comprising:
   a first region of a first conductivity type which is doped with a first impurity having a first concentration;

a second region of a second conductivity type which is provided on said first region and is doped with a second impurity having a second concentration which is lower than the first concentration;

a third region of said first conductivity type which is selectively formed in the surface of said second region;

a fourth region of said second conductivity type which is selectively formed in the surface of said third region;

a fifth region of said second conductivity type which is selectively formed so that it protrudes through said fourth region into said third region; and a sixth region of said first conductivity type which is selectively formed so that it is in contact with said fifth region, wherein, an impurity dose amount in said third region is within the range of $1 \times 10^{13}$ cm$^{-2}$ to $7 \times 10^{14}$ cm$^{-2}$ and an impurity concentration in said third region is within the range of $1.25 \times 10^{16}$ cm$^{-3}$ to $8.75 \times 10^{17}$ cm$^{-3}$.

* * * * *